United States Patent [19]
Nagasawa et al.

[11] Patent Number: 5,446,744
[45] Date of Patent: Aug. 29, 1995

[54] IMAGE SIGNAL CODING DEVICE

[75] Inventors: Kenichi Nagasawa; Akihiro Shikakura, both of Kawasaki, Japan

[73] Assignee: Canon Kabushiki Kaisha, Tokyo, Japan

[21] Appl. No.: 385,722

[22] Filed: Feb. 8, 1995

Related U.S. Application Data

[63] Continuation of Ser. No. 827,164, Jan. 28, 1992, abandoned.

[30] Foreign Application Priority Data

Jan. 29, 1991 [JP] Japan .................................. 3-009148
Feb. 7, 1991 [JP] Japan .................................. 3-016470

[51] Int. Cl.⁶ .............................................. G06F 11/10
[52] U.S. Cl. .................... 371/37.4; 371/37.1; 348/466
[58] Field of Search .................. 371/37.1, 37.3, 37.4, 371/39.1; 348/461, 465, 466, 473; 364/265.1, 265.2

[56] References Cited

U.S. PATENT DOCUMENTS

| | | | |
|---|---|---|---|
| 4,445,216 | 4/1984 | Kobari et al. | 371/37.4 |
| 4,569,051 | 2/1986 | Wilkinson | 371/37.1 |
| 4,660,200 | 4/1987 | Okamoto et al. | 371/39 |
| 4,716,567 | 12/1987 | Ito et al. | 371/37 |
| 4,955,022 | 9/1990 | Odaka | 371/37.4 |
| 5,070,503 | 12/1991 | Shikakura | 371/37.1 |
| 5,130,993 | 7/1992 | Gutman et al. | 371/37.1 |
| 5,159,452 | 10/1992 | Kinoshita et al. | 371/39.1 |
| 5,237,574 | 8/1993 | Weng | 371/40.1 |
| 5,247,579 | 9/1993 | Hardwick et al. | 371/37.4 |
| 5,309,292 | 5/1994 | Takakura | 360/48 |
| 5,309,450 | 5/1994 | Kim | 371/39.1 |
| 5,355,379 | 10/1994 | Holson et al. | 371/31 |

FOREIGN PATENT DOCUMENTS

0039565 11/1981 European Pat. Off. .
0191410 8/1986 European Pat. Off. .

OTHER PUBLICATIONS

C. Yamamitsu A. Idle et al. 'An experimentay study for a home–use digital VRT' Jun. 9, 1989 pp. 450 to 456.
IEEE Trans. Consumer Electronics, vol. 35, No. 3, Aug. 1989, pp. 450–457, Yamamitsu et al. "An Experimental Study For A Home–Use Digital VTR".
Pat. Abs. Jp. vol. 14, No. 4, Sep. 7, 1990 and JP-A-2159186.
Proc. 3rd Int. Workshop on HDTV, Aug. 1989, pp. 769–766, del Pero et al. et al. "Criteria For The Protection Of The Video Information In A Codec Based On DCT".

*Primary Examiner*—Robert W. Beausoliel, Jr.
*Assistant Examiner*—Albert Decady
*Attorney, Agent, or Firm*—Fitzpatrick, Cella, Harper & Scinto

[57] ABSTRACT

When forming a data block which includes both an image code obtained by carrying out variable length coding for each of plural regions resulting from dividing each picture provided by an image signal, and added information associated therewith, boundary information indicative of a position, in the data block, of the boundary between the image codes in two adjacent regions of the divided regions is added to the data block. There are also formed in the data block a first error detection or correction code to make up a code word which includes the boundary code, but does not include the image code, and a second error detection or correction code to make up a code word which includes both the image code and the boundary code. Alternatively, in the block which includes main information and added information associated with the main information in time series there are formed a first error detection or correction code to make up a code word which does not include the main information, but includes both the added information and a first check bit, and a second error detection or correction code to make up a code word which does not include the first check bit, but includes the added information, the main information and a second check bit.

11 Claims, 9 Drawing Sheets

○ ---- FIRST RESYNC. BLOCK COMPRESSION DATA

☆ ---- BOUNDARY OF FIRST RESYNC. BLOCK COMPRESSION DATA (POSITION OF FINAL DATA)

● ---- SECOND RESYNC. BLOCK COMPRESSION DATA

★ ---- BOUNDARY OF SECOND RESYNC. BLOCK COMPRESSION DATA (POSITION OF FINAL DATA)

◎ ---- THIRD RESYNC. BLOCK COMPRESSION DATA

ⓑ ---- BOUNDARY OF THIRD RESYNC. BLOCK COMPRESSION DATA (POSITION OF FINAL DATA)

IMAGE SIGNAL CODING DEVICE

This application is a continuation of application Ser. No. 07/827,164, filed Jan. 28, 1992, now abandoned.

BACKGROUND OF THE INVENTION

1. Field of the Invention

The present invention relates to an image signal coding device, and more particularly to an image signal coding device for outputting image information while coding the same into variable length codes and also adding error detection and correction codes thereto.

2. Related Background Art

Recently, highly efficient coding technology of information has been developed and a high degree of compression has been realized in the field of digital transmission of color images.

With such progress, images of good quality can be transmitted and received via transmission lines even at a low data rate. On the contrary, an error of one word occurring on transmission lines causes a larger influence upon images. For this reason, some measures are required for coping with code errors occurring on transmission lines by using an error detection code, an error correction code, or the like.

Particularly, when using transmission lines, such as magnetic recording media and communication satellites, where transmission quality is expected to deteriorate, special consideration should be paid to the measures taken for compensating for such code errors.

FIG. 1 is a block diagram showing a schematic configuration of a conventional image transmitting and receiving system.

In FIG. 1, denoted at 101 is a terminal to which an image signal is input. The image signal inputted through the terminal 101 is converted into digital form by an analog-to-digital (hereinafter abbreviated as A/D) converter 102. The digitized image signal is coded by a highly efficient coding circuit 103 for being compressed in the amount (band) of information.

The image information compressed by the coding circuit 103 is supplied to an error correction coding circuit 104 where a parity check bit for correcting a code error is added thereto (for the purpose of error correction coding), followed by delivery to a transmission line 105.

On the receiving side, a string of data received via the transmission line 105 is once stored in a memory 106, and an error correction unit 107 accessible to the memory 106 carries out correction of the code error by using the parity check bit. The image information subjected to the code error correction is output from the memory 106 and applied to a highly efficient decoding circuit 108. The decoding circuit 108 performs the process reversed to that of the above highly efficient coding circuit 103 for expanding the amount (band) of information to restore the original digital image signal. This digital image signal is converted into analog form by a digital-to-analog (hereinafter abbreviated as D/A) converter 109 and then delivered as an analog image signal from a terminal 110.

As to the configuration of the highly efficient coding circuit 103, i.e., the image compressing technique, in FIG. 1, there have been proposed a variety of methods. More specifically, the so-called ADCT method is proposed as a typical one of color image coding techniques. The ADCT method is described in detail in an article by Takahiro Saito, et al., "Coding Technique of still Images", Journal of Television Society of Japan, Vol. 44, No. 2 (1990), a report by Hiroshi Ochi, et al., "International Standard Trend of Still Image Coding", Proceedings No. 14 for National Meeting of Image Electronic Society of Japan, 1988, etc.

FIG. 2 is a block diagram schematically showing a configuration of the highly efficient coding circuit for images using the ADCT method.

In FIG. 2, an image signal applied to a terminal 111 is given by a string of digital data which has been converted into 8 bits, i.e., 256 gradations/color, in the A/D converter 102 in FIG. 1. The number of colors is three or four such as represented by RGB, YUV, $YP_bP_r$ or YMCK.

The input digital image signal is immediately subjected to two-dimensional discrete cosine transform (hereinafter abbreviated as DCT) in a DCT transformer 112 in units of subblock comprising $(8 \times 8)$ pixels.

The DCT-transformed data of $(8 \times 8)$ words (hereinafter referred to as conversion coefficients) are quantized in a linear quantization circuit 113 with quantizing step sizes being different for every conversion coefficients. Thus, the quantizing step sizes for respective conversion coefficients are given by values output from a multiplier 116 which multiplies quantizing matrix elements of $(8 \times 8)$ from a quantizing matrix generator 114 by $2^S$.

The quantizing matrix elements are determined in consideration of the fact that visual sensitivity for quantizing noise is different for each of the conversion coefficients of $(8 \times 8)$ words. One example of the quantizing matrix elements is shown in Table 1 below.

On the other hand, the data of $2^S$ is obtained from a data generator 115 and the value of S is O or a positive or negative integer called a scaling factor. The image quality or the amount of data is controlled depending on the value of S.

TABLE 1

| One Example of Quantizing Matrix Elements | | | | | | | |
|---|---|---|---|---|---|---|---|
| 16 | 11 | 10 | 16 | 24 | 40 | 51 | 61 |
| 12 | 12 | 14 | 19 | 26 | 58 | 60 | 55 |
| 14 | 13 | 16 | 24 | 40 | 57 | 69 | 56 |
| 14 | 17 | 22 | 29 | 51 | 87 | 80 | 62 |
| 18 | 22 | 37 | 56 | 68 | 109 | 103 | 77 |
| 24 | 35 | 55 | 64 | 81 | 104 | 113 | 92 |
| 49 | 64 | 78 | 87 | 103 | 121 | 120 | 101 |
| 72 | 92 | 95 | 98 | 112 | 100 | 103 | 99 |

DC components of the respective quantized conversion coefficients, i.e., DC conversion coefficients in the matrix of $(8 \times 8)$ (hereinafter referred to as DC components), are supplied to a one-dimensional prediction difference circuit 117, and prediction errors obtained by the circuit 117 are subjected to Huffman coding in a Huffman coding circuit 118. More specifically, after dividing quantized outputs of the prediction errors into groups, the ID numbers of the groups to which the respective prediction errors belong are first subjected to Huffman coding, and which values in each groups correspond to the respective prediction errors are then represented by using equi-length codes.

The conversion coefficients other than the above DC components, i.e., the AC conversion coefficients (hereinafter referred to as AC components), are supplied to a zigzag scanning circuit 119 in which the AC components are scanned in a zigzag manner with two-dimensional frequencies from low-frequency component to high-frequency component as shown in FIG. 3. The circuit 119 outputs, to a Huffman coding circuit 120, a combination of those conversion coefficients for which the quantized outputs are not 0 (hereinafter referred to as significant coefficients), and the number (run-length) of those conversion coefficients which are present between the just preceding significant coefficient and the present significant coefficient and for which the quantized outputs are 0 (hereinafter referred to as insignificant coefficients).

The Huffman coding circuit 120 divides the AC components into groups depending on the values of the significant coefficients. The ID numbers of these groups and the respective run-lengths are subjected to Huffman coding in pair, and which values in each group correspond to the respective significant coefficients are then represented by using equi-length codes.

Outputs of the Huffman coding circuits 118, 120 are multiplexed in a multiplexing circuit 121 and supplied as a coded output to a downstream error correction coding circuit 104 from a terminal 122.

With the highly efficient coding as mentioned above, no deterioration of images is found and extremely efficient compression can be performed even when the amount of information is compressed to fractional parts of the original amount.

However, in the system adapted for such superior compression efficiency, i.e., compression of information at a high compression rate, one code error poses a serious influence upon an image.

Where the system is designed to carry out the variable length coding as set forth above, for example, a code error may lead to incapability of the subsequent decoding process, resulting in that images after occurrence of the error are so disturbed as to look very indistinct or awkward.

Further, in the system of performing the compression at such a high compression rate, if a correction impossible error occurs in key codes for the decoding process, reproduced images generally suffer from a fatal failure.

Particularly, that type system has also been recently employed for those transmission lines in which transmission quality may be changed and deteriorated depending on weather conditions, as represented by communication satellites. It is therefore needed for measures capable of protecting data against errors occurring on transmission lines.

However, simply stepping up the measures to prevent errors merely results in the increased redundancy of codes. This means that the advantage of image compression made with high efficiency using the advanced technique is canceled out.

Such simple step-up also prolongs the length of code, such as an error detection code and an error correction code relatively, which in turn complicates arithmetic operations necessary in both the coding and decoding processes. This eventually increases the structural size of hardware or prevents a reduction of the processing time, and thus impedes wider practical use of the system as stated above.

SUMMARY OF THE INVENTION

An object of the present invention is to solve the prior art problems in view of the foregoing background circumstances.

Another object of the present invention is to provide an image signal coding device which can minimize influences of a code error occurring on a transmission line upon images, without increasing redundancy of data.

To achieve the above object, in accordance with one form of the present invention, there is proposed an image signal coding device, comprising (a) coding means for carrying out variable length coding for each of plural regions resulting from dividing each picture provided by an image signal, and outputting image codes; (b) block forming means for forming a data block which includes the image codes; (c) boundary forming means for forming boundary information indicative of a position, in the data block, of the boundary between the image codes in adjacent twos of the divided regions, said boundary information being added into the data block; and (d) error detection or correction coding means for forming, in the data block, a first error detection or correction code to make up a code word which includes the boundary code, but does not include the image code, and a second error detection or correction code to make up a code word which includes both the image code and the boundary code.

Still another object of the present invention is to provide an error detection or correction coding device which can shorten the length of an error detection or correction code, and has a sufficiently high error detecting or correcting capability for specific data.

To achieve the above object, in accordance with another form of the present invention, there is proposed an error detection and/or correction code coding device, comprising (a) block forming means for forming a data block which includes main information and added information associated with the main information in time series; (b) first means for forming, in the data block, a first error detection or correction code to make up a code word which does not include the main information, but includes both the added information and a first check bit; and (c) second means for forming a second error detection or correction code to make up a code word which does not include the first check bit, but includes the added information, the main information and a second check bit.

Other objects and features of the present invention will be apparent from the following detailed description of preferred embodiments of the invention with reference to the drawings.

DETAILED DESCRIPTION OF THE PREFERRED EMBODIMENTS

Hereinafter, the present invention will be described in detail by referring to an embodiment in which the invention is applied to a system for transmitting an image signal through variable length coding.

Figure 4:
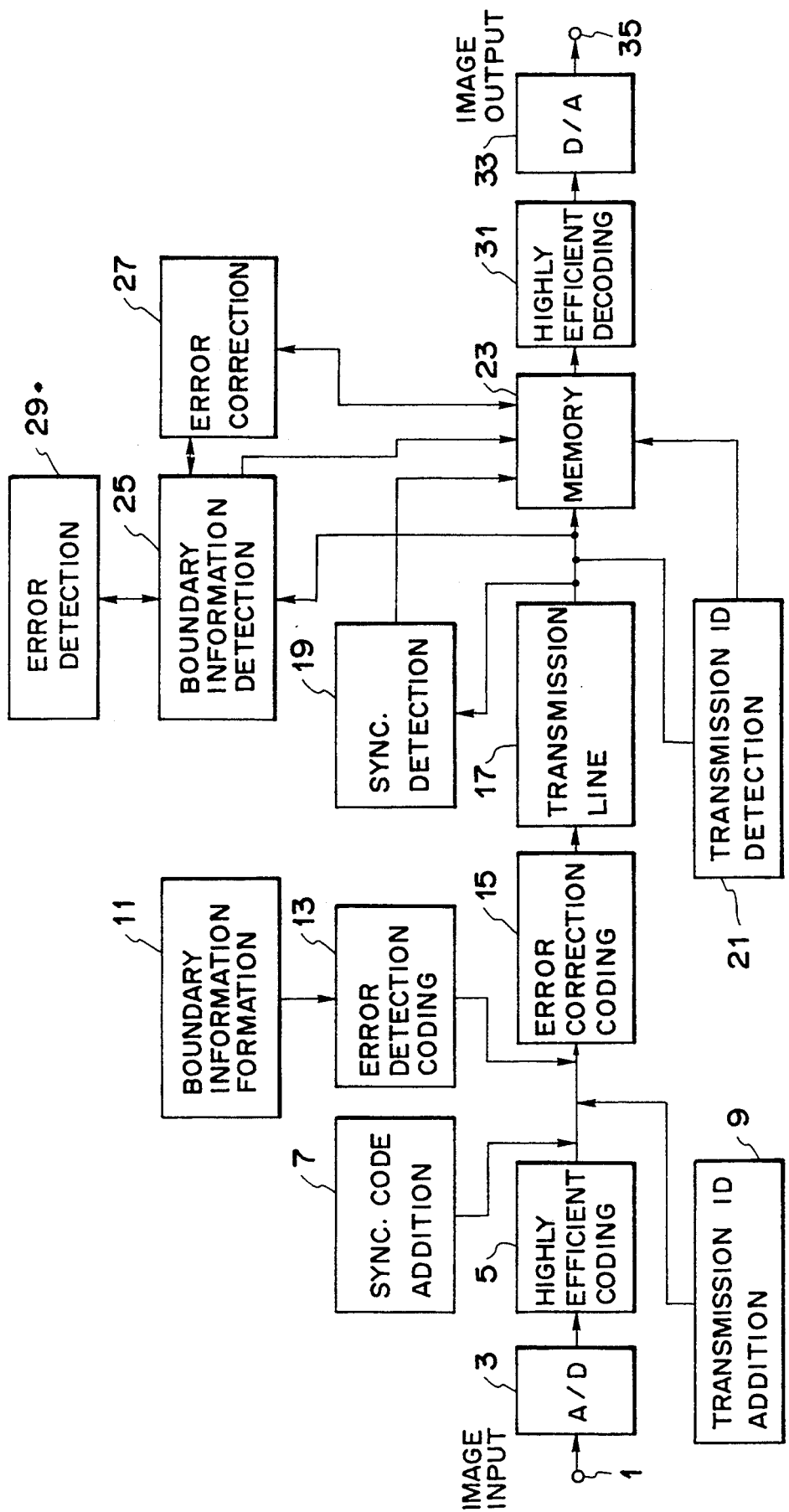
FIG. 4 is a block diagram showing a schematic configuration of an image transmitting and receiving system according to one embodiment of the present invention.

FIG. 4 is a block diagram showing a schematic configuration of an image transmitting and receiving system according to one embodiment of the present invention. The description will now be made in conjunction with FIG. 4.

Figure 1:
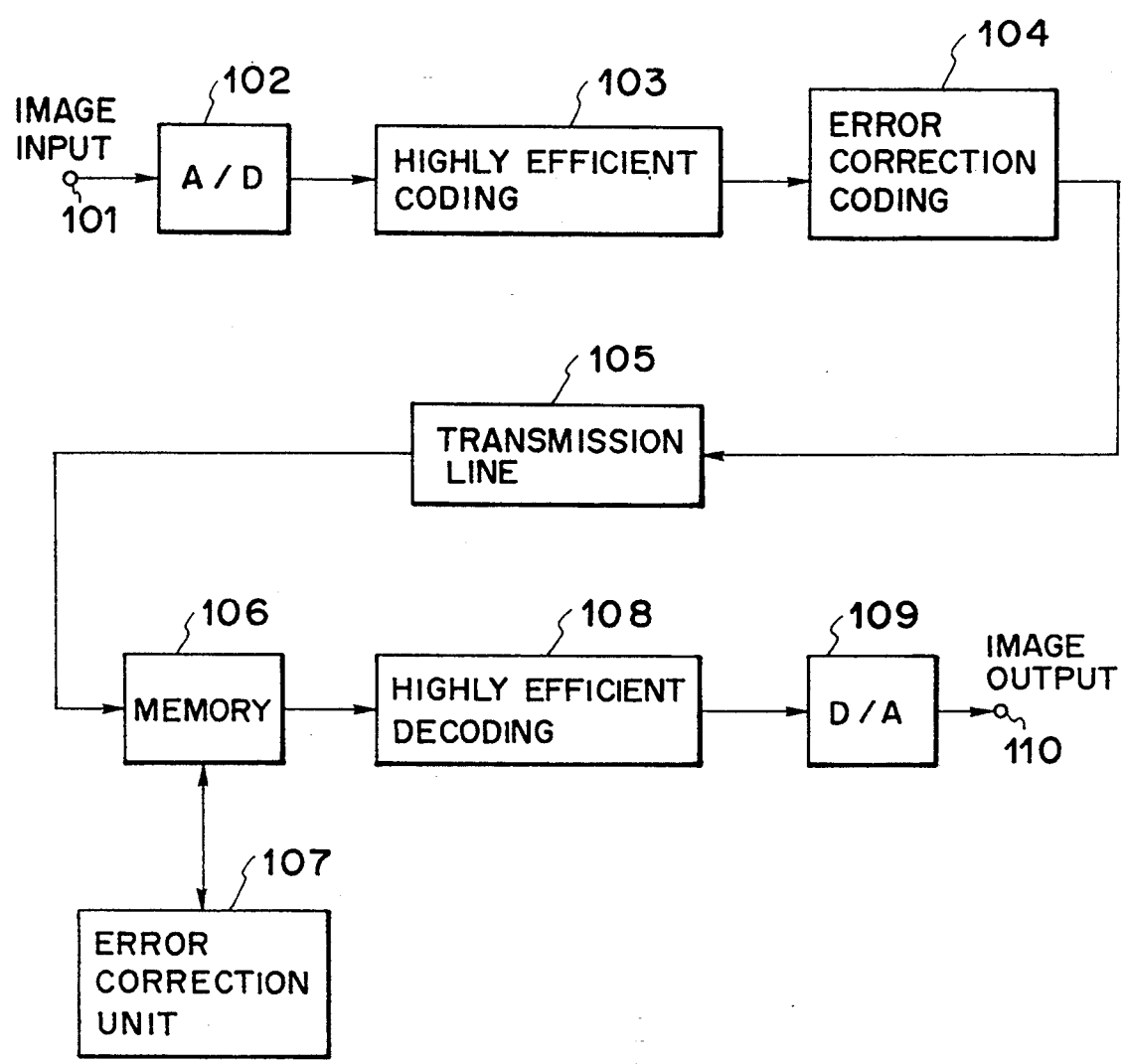
FIG. 1 is a block diagram showing a schematic configuration of a conventional image transmitting and receiving system.
Figure 2:
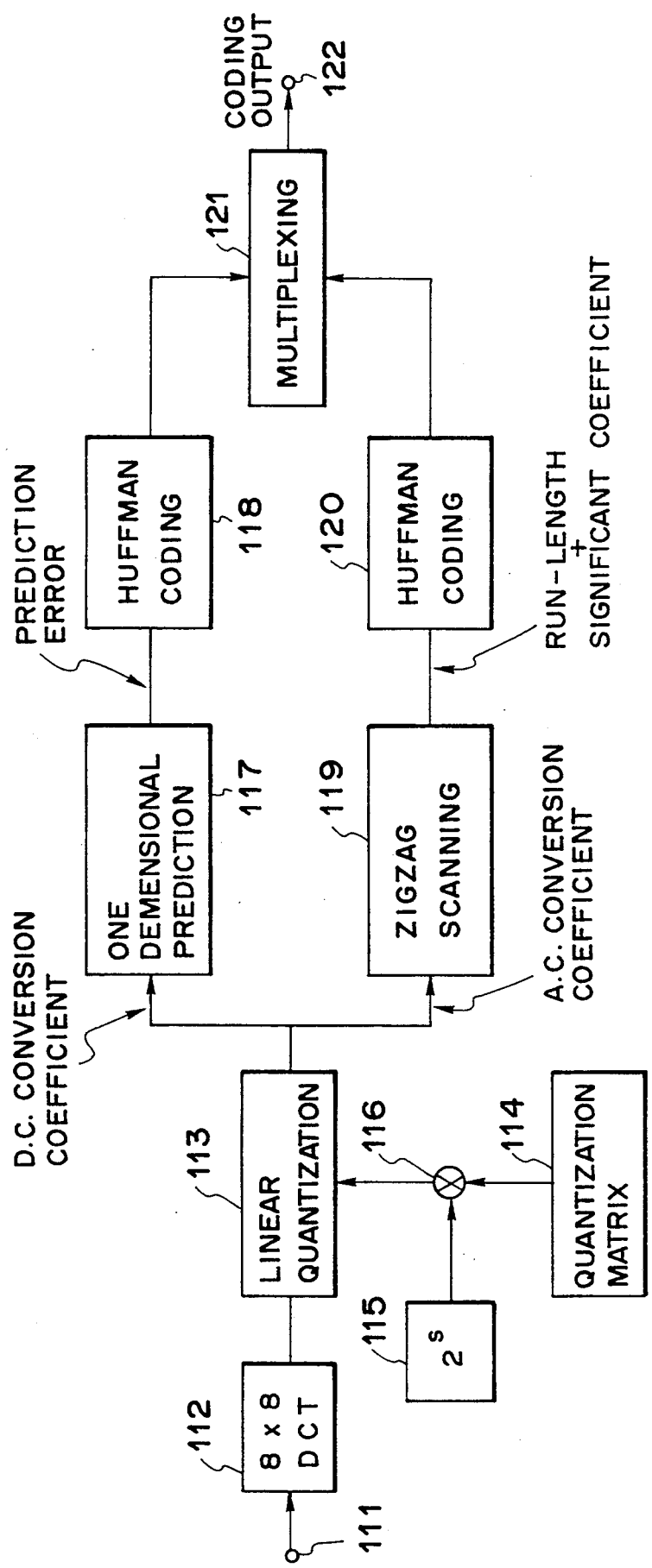
FIG. 2 is a block diagram schematically showing a configuration of a highly efficient coding circuit for images using the ADCT method.
Figure 3:
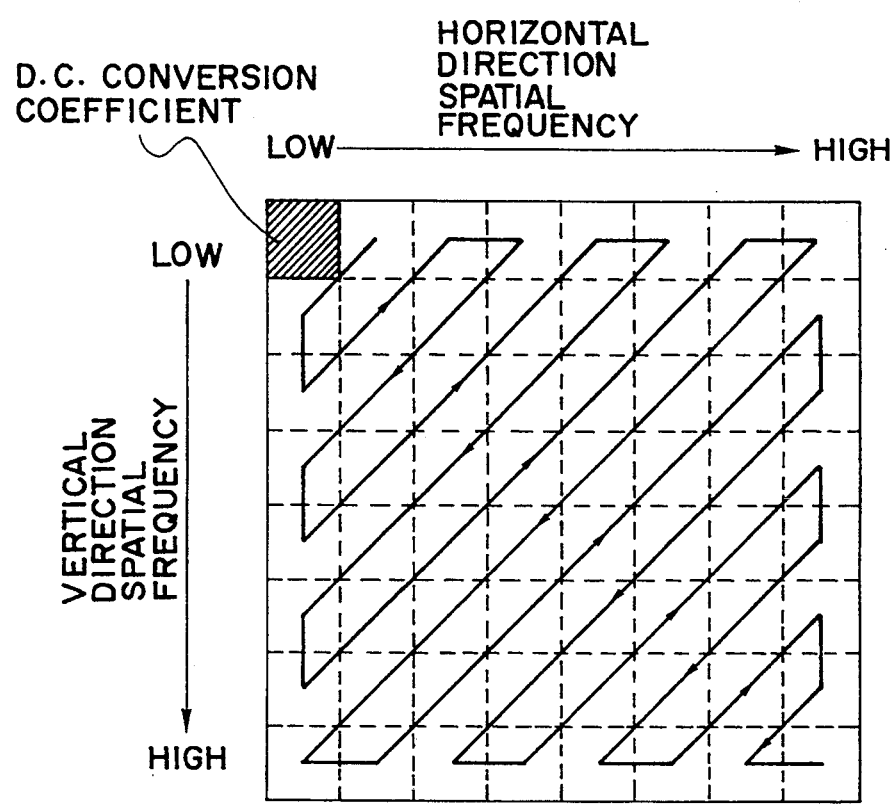
FIG. 3 is a diagram showing a manner of zigzag scanning in a zigzag scanning circuit shown in FIG. 2.

An analog image signal applied through an input terminal 1 is converted into digital form by an A/D converter 3 and then subjected in a highly efficient coding circuit 5 to variable length compression coding as explained before by referring to FIG. 2. A string of data thus subjected to the compression coding is supplied to a synch code adding circuit 7 where a synch code is inserted at a predetermined position.

Further, a transmission ID adding circuit 9 inserts an added information (transmission ID) relating to the transmission through the present system, e.g., a synch block number, into the string of data.

Denoted at 11 is a boundary information forming circuit. Boundary information stands for the boundary between information (i.e., compression-coded data) in adjacent two regions defined by dividing one picture into a plurality of regions as described later. The boundary information is vital information corresponding to first information or added information in the present invention. Therefore, a check bit for an error detection code is added and inserted into the string of data in an error detection coding circuit 13. The error detection coding circuit 13 corresponds to first error detection or correction coding means, or error detection coding means in the present invention.

Denoted at 15 is an error correction coding circuit adapted to carry out error correction coding for the boundary information and the compression-coded image data. The error correction coding circuit 15 corresponds to second error detection or correction coding means, or error correction coding means in the present invention. Also, the compression-coded image data corresponds to second information or main information in the present invention.

The error correction coding circuit 15 inserts a parity check bit for an error correcting code at a predetermined in the string of data, followed by delivery to a transmission line 17.

The transmission line 17 may be an instantaneous-type transmission line in the form of transmission media such as optical fibers, satellites and microwave guides using ground electric waves, optical spaces, etc. Alternatively, the transmission line 17 may be an accumulation-type transmission line in the form of storage media including tape-like media such as digital VTRs and DATs, disk-like media such as floppy disks and optical disks, semiconductor memories, etc.

A transmission rate is determined depending on the amount of information of the original image, the compression rate, and the transmission time, and usually ranges from several tens kilo bits/sec to several tens mega bits/sec.

The string of data received through the transmission line 17 on the receiving side is supplied to a synch code detecting circuit 19 where the aforesaid synch code is separated from the string of data for detection. Further, a transmission ID detecting circuit 21 detects the aforesaid transmission ID for such as detecting attributes of each synch block.

A boundary information detecting circuit 25 separates and detects the aforesaid boundary information. A memory 23 stores the string of data in accordance with the synch code and the transmission ID.

An error correcting unit 27 makes an access to both the memory 23 and a memory inside the boundary information detecting circuit 25 to correct code errors for the compression-coded image data and the boundary information. It is a matter of course that this correction is carried out by using the check bits added in the aforesaid error correction coding circuit 15.

The error correcting unit 27 also detects code errors for the boundary information, on which the error correcting process has been conducted, by using the check bits added in the aforesaid error detection coding circuit 13. Thus, since this embodiment is designed to performs the error correction and detection for the boundary information in a double manner, reliability of the boundary information restored on the receiving side can be improved.

In the boundary information detecting circuit 25, the boundary on the string of compression-coded data between every adjacent two regions defined by dividing one picture is detected, following by supplying the detected information to the memory 23. In accordance with this boundary information, the highly efficient decoding circuit 31 takes in only that image data which has been subjected to the variable length coding, expands the image data for decoding, and further supplies a digital image signal, now restored to the original amount (band) of information, to a D/A converter 33. In this way, an analog image signal is delivered through an output terminal 35.

In the decoding process of expanding the variable length data in the highly efficient decoding circuit 31, if the boundary on the string of compressed data between every two divided regions is falsely detected, the proper decoding process could not be effected any longer, leading to a failure in the reproduction of an image. On the contrary, since the error correction can be made for the boundary information by using the error correction code and the false correction of the error correction code can also be detected by using the error detection code in this embodiment as stated before, it is possible to precisely reproduce the boundary information on the receiving side.

Details of the system of this embodiment will be explained below by referring to FIGS. 5, 6, 7 and 8.

Figure 5:
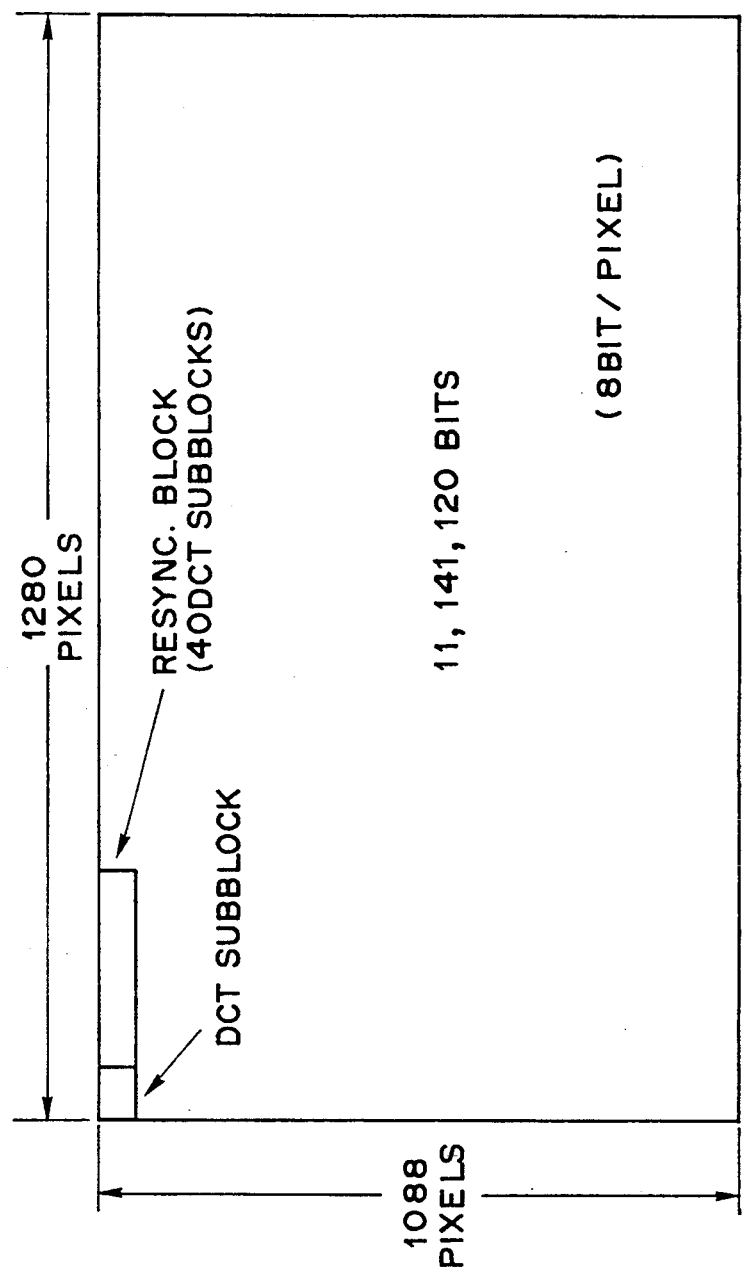
FIG. 5 is a diagram schematically showing information for one picture of pixels to be transmitted through the system of FIG. 4.

FIG. 5 is a diagram schematically showing information for one picture of pixels to be transmitted. It is supposed that one picture is sampled with a horizontal size of 1280 pixels and a vertical size of 1088 pixels, and each pixel is A/D-converted using 8 bits. Thus, the amount of data per one picture is given by:

$$1280 \times 1088 \times 8 = 11,141,120 \text{ bits}$$

Also supposing that this embodiment is adapted for transmission of moving pictures and the data comprising the above number of bits per one picture is transmitted at a rate of 30 pictures/sec, the amount of data per one second is given by:

$$11,141,120 \times 30 = 334,233,600 \text{ bits/sec}$$

Let now it to be assumed that such information of moving images is transmitted by being compression-coded into about 1/10 of the original data amount using the ADCT method stated before.

Here, one DCT subblock consists of (horizontal 8 pixels) × (vertical 8 pixels) and one resynch block consists of 40 DCT subblocks, as shown in FIG. 5. Thus, by dividing one picture in units of resynch block, each picture is divided into total 544 regions of (horizontal 4) × (vertical 136).

Therefore, the capacity of one resynch block is given by:

$$40 \times 8 \times 8 \times 8 = 20,480 \text{ bits}$$

Figure 6:
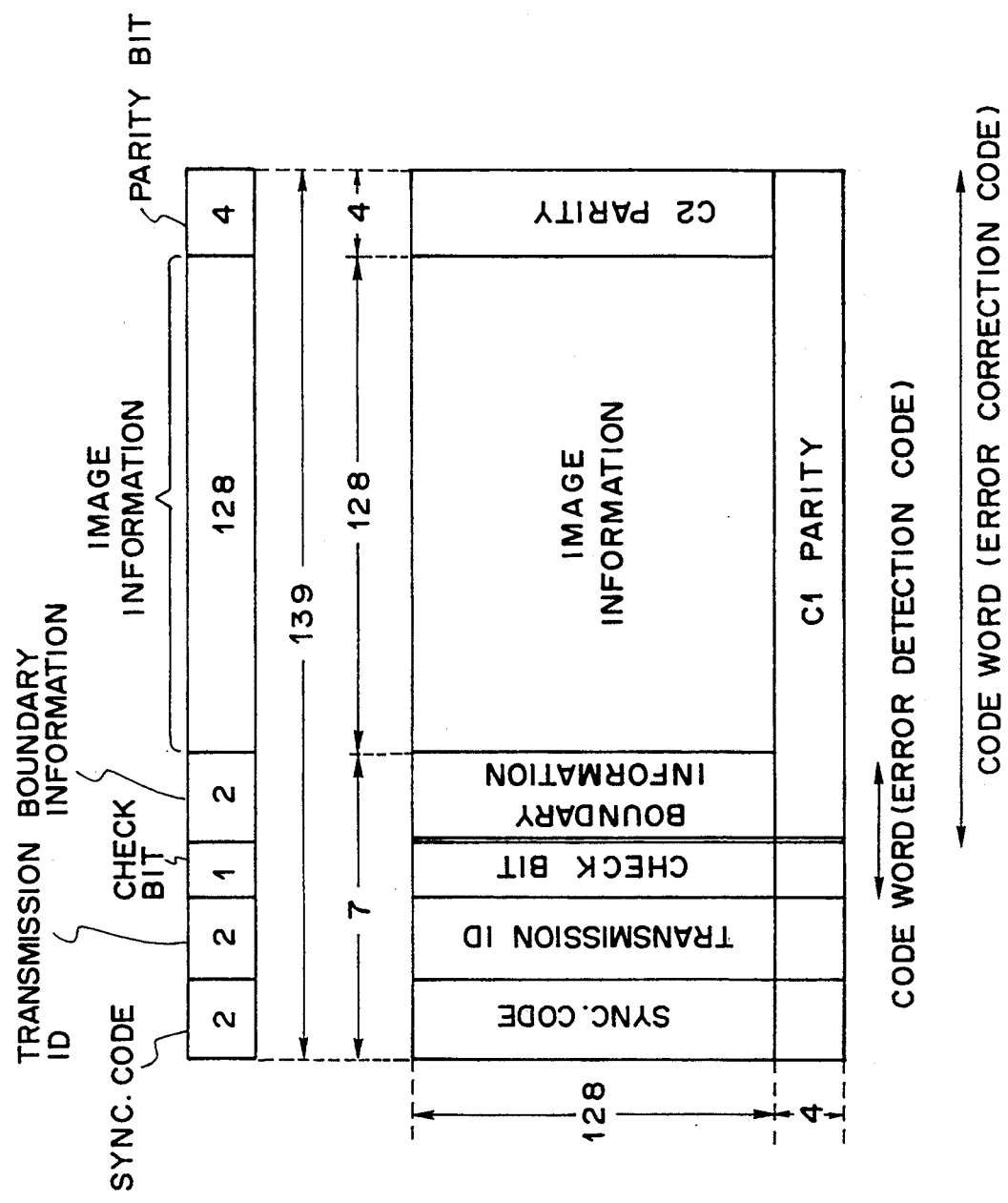
FIG. 6 is a diagram showing a data transmission format, particularly a format for an error correcting block, used in the image transmitting and receiving system according to one embodiment of the present invention.

FIG. 6 shows a data transmission format, particularly a format for an error correcting block (ECC block), used in the system of this embodiment. As shown, for the boundary information of 2 symbols, there is added a check bit in the form of a CRCC (cyclic redundancy check code) of 1 symbol (8 bits).

Further, in the illustrated example, a double Reed-Solomon code is used as the error correction code for both the boundary information and the compression-coded image information.

FIG. 6 indicates a range of code word covered by the error detection code using a CRCC and a range of code word covered by the error correction code using an outer code of the double Reed.Solomon code. As will be seen from FIG. 6, the CRCC check bit of 1 symbol is added to the boundary information of 2 symbols.

Also, the outer code check bit (C2 parity) of 4 symbols for the error correction code are added to both the boundary information of 2 symbols which has been subjected to the error detection coding and the image information of 128 symbols which has been subjected to the compression coding.

Additionally, for both the image information and the boundary information of 128 symbols in the vertical direction as shown, there is added a check bit (C1 parity) of 4 symbols using an inner code of the double Reed.Solomon code.

In the illustrated case, the error correction can be made in 2 symbols at maximum by using the error correction code in each of the vertical and horizontal directions. Moreover, as to the boundary information having been subjected to the correcting process using the error correction code, even when an error has been overlooked or the correction has been mistaken in the previous correcting process with the error correction code, such a still existing error can be detected by using the error detection code. It is thus possible to precisely determine whether the boundary information reproduced on the receiving side is proper or not, and also prevent the false boundary information from being used in the later-explained process of decoding the compressed codes.

Besides, since the code word for the outer code of the double Reed.Solomon code includes no CRCC check bit, the length of the code word is suppressed to be as short as possible. Therefore, while sufficiently protecting the boundary information and preventing the false correction as set forth above, the structure of hardware can be suppressed to a relatively small size and a reduction of the processing speed can be avoided.

On the upper side of FIG. 6, there is shown a transmission block (synch block) corresponding to one horizontal row which contains together the image information of 128 symbols and the C2 parity of 4 symbols, or the C1 parity of 132 symbols, as well as the boundary information of 2 symbols, the synch code of 2 symbols, the transmission ID of 2 symbols and the check bit of 1 symbol all added thereto. Then, 132 transmission blocks are put together to make up one ECC block.

Accordingly, assuming that 10 ECC blocks are assigned to the transmitted image information for each picture, the transmission capacity required for one picture is given by:

$$128 \times 128 \times 8 \times 10 = 1,310,720 \text{ bits}$$

Stated in other words, it is found that the aforesaid amount of data per one picture needs to be compressed about 11% of the original amount.

Further, in the case of a moving picture transmission to transmit 30 pictures for each second, the transmission capacity per one second is given by:

$$1,310,720 \times 30 = 39,321,600 \text{ bits/sec}$$

A total transmission rate in this case becomes not less than:

$$138 \times 132 \times 8 \times 10 \times 30 = 43,718,400 \text{ bits/sec}$$

The synch code in FIG. 6 is to detect synch of the above transmission block and comprises a fixed pattern determined in advance. The transmission ID stands for each of the numbers of transmission blocks required to be set for transmitting one picture. Because of comprising 16 bits, the transmission ID can express about 65,000 ($=2^{16}$) transmission blocks. In the illustrated embodiment, since there are $132 \times 10 = 1,320$ transmission blocks, 11 bits are enough to express them.

Figure 7:
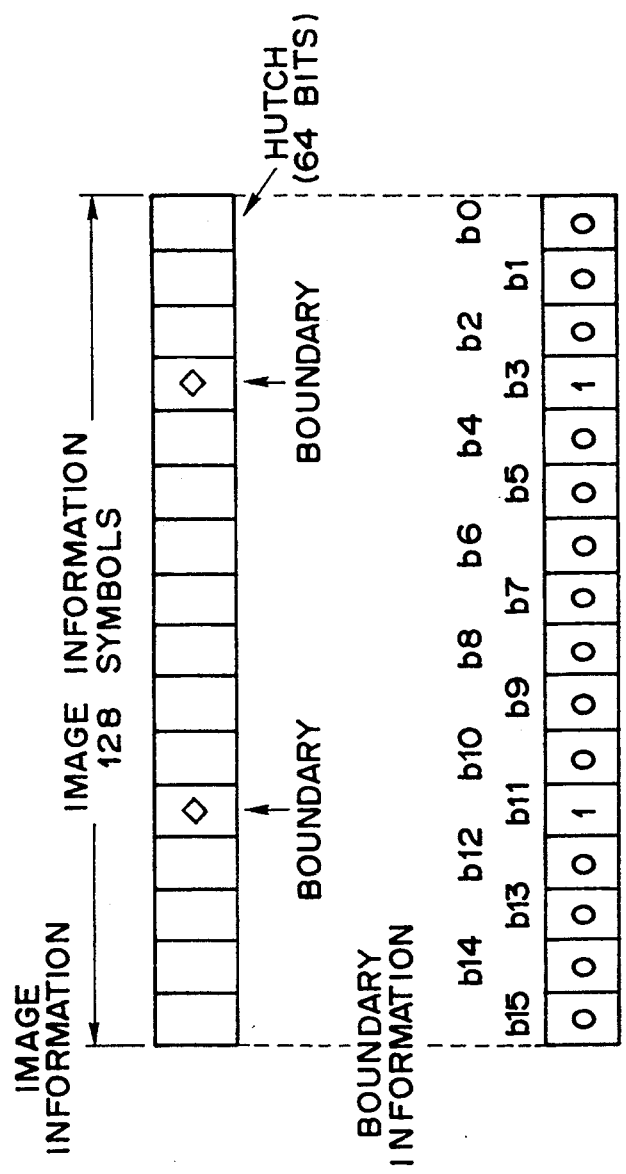
FIG. 7 is a diagram showing the relationship between boundary information and image information in the system of FIG. 4.

FIG. 7 shows the relationship between the image information shown in FIG. 6 and the boundary information in this embodiment. The image information area of 128 symbols in FIG. 6 is divided into hutches each comprising 8 symbols, i.e., 64 bits, and 16 bits of the boundary information correspond to the respective hutches. Assuming now that the aforesaid boundaries between the resynch blocks of image information to be transmitted are present at the 5th and 13th hutches from the left, a bit "1" is set at each of the corresponding 5th and 13th bits of the boundary information from the left (all other bits remaining at "0"), thereby forming the boundary information.

Figure 8:
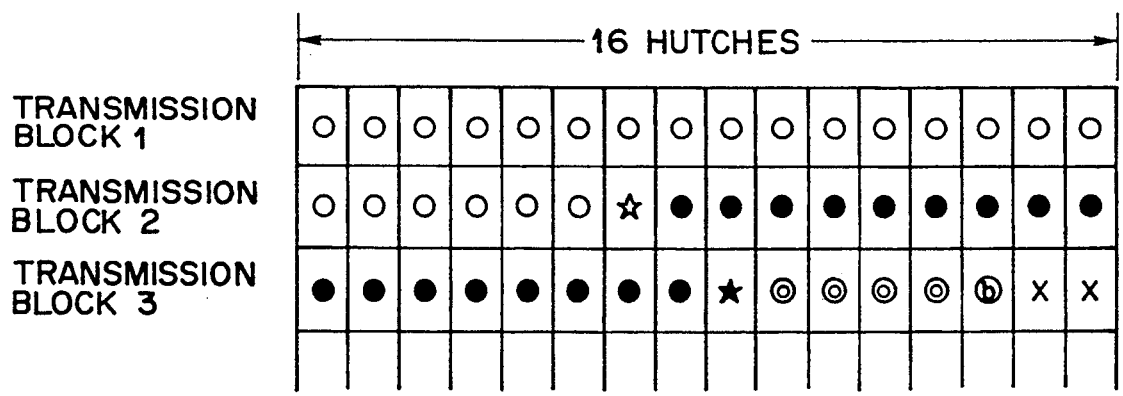
FIG. 8 is a diagram for explaining a manner of transmitting image information, subjected to variable length coding, through the system of FIG. 4.

FIG. 8 is a diagram for explaining a manner of transmitting image information compressed (or subjected to variable length coding).

On the side of delivering the image information which has been subjected to the highly efficient coding, for the first resynch block, the number (resynch number) of 2 symbols (16 bits) representing the first resynch block is output at the beginning, followed by outputting the compressed image information from the third symbol.

To put it in more detail, as explained before in connection with FIG. 2, the image information in the first resynch block is subjected to the DCT in units of subblock comprising (8×8) pixels, followed by linear quantization of conversion coefficients. The quantizing step sizes are different for every conversion coefficients. Thus, the quantizing step sizes for respective conversion coefficients are given by values equal to $2^S$ multiplied by quantizing matrix elements of (8×8) which are determined in consideration of the difference in visual sensitivity for quantizing noise for each of the conversion coefficients.

Here, S is a scaling factor and its value is 0 or a positive or negative integer. The image quality or the amount of data generated is controlled depending on the value of S such that the data amount is compressed to about 1/10. After the quantization, as to the DC components, one-dimensional prediction is carried out between two adjacent subblocks with the difference value from 0 being used for the first DCT subblock, and the resulting prediction errors are subjected to Huffman coding. More specifically, after dividing quantized outputs of the prediction errors into groups, the ID numbers of the groups to which the respective prediction errors belong are first subjected to Huffman coding, and which values in each group correspond to the respective prediction errors are then represented by using equi-length codes.

The AC components are coded while zigzag-scanning the quantized output from a low-frequency component to a high-frequency component. More specifically, the significant coefficients are divided into groups depending on their values. The ID numbers of these groups and the number of insignificant coefficients which are present between the just preceding significant coefficient and the present significant coefficient are subjected to Huffman coding in pair, and which values in each group correspond to the respective significant coefficients are then represented by using equi-length codes. By repeating the similar operation to the above, the image information is coded over 40 DCT subblocks and the output variable length codes are rearranged in units of symbol comprising 8 bits, followed by delivery to the image information area in the transmission block. For the hutch which contains the final bit of the compressed information corresponding to one resynch block, i.e., 40 DCT subblocks, no data is written in the remaining region of that hutch (i.e., the boundary hutch) to define it as indefinite bits, and a flag "1" is set to the bit of the boundary information corresponding to the boundary hutch at the present time.

Next, for the second resynch block, the number (resynch number) of 2 symbols (16 bits) representing the second resynch block is outputted from the beginning of the hutch subsequent to the last one used by the first resynch block, followed by outputting the compressed image information from the third symbol.

As to the DC components, one-dimensional prediction is carried out between two adjacent subblocks with the difference value from 0 being used for the first DCT subblock, and the resulting prediction errors are subjected to Huffman coding. More specifically, after dividing quantized outputs of the prediction errors into groups, the ID numbers of the groups to which the respective prediction errors belong are first subjected to Huffman coding, and which values in each group correspond to the respective prediction errors are then represented by using equi-length codes.

The AC components are coded while zigzag-scanning the quantized outputs from low-frequency component to high-frequency component. The output variable length codes are rearranged in units of symbol comprising 8 bits, followed by delivery to the image information area in the transmission blocks. For the hutch which contains the final bit of the compressed information corresponding to one resynch block, i.e., 40 DCT subblocks, no data is written in the remaining region of that hutch to define it as indefinite bits, and a flag "1" is set to the bit of the boundary information corresponding to the boundary hutch at the present time.

The above operation will be similarly repeated until the final resynch block, to thereby complete the highly efficient coding of the image data and the forming of the boundary information.

On the decoding side, the data received through the transmission line 17 in FIG. 4 is first supplied to the synch code detecting circuit 19 for detecting the aforesaid synch code, and then supplied to the transmission ID detecting circuit 21 for detecting the aforesaid transmission ID (transmission block number). The memory 23 is controlled in writing timing by the synch code and stores the transmitted data into the address corresponding to the transmission block number. The capacity of the memory 23 is set not less than the amount of information contained in the transmitted data per one picture.

Further, as mentioned before, the error correcting unit 27 serves to correct errors in both the boundary information and the compressed image information and, even when an error has been overlooked or the correction has been mistaken in the previous correcting process with the error correction code, the error detecting unit 29 serves to detect an error still existing in the boundary information. It is thus possible to precisely extract only the proper boundary information, and also prevent the false boundary information from being used in the process of decoding the compressed codes.

When reading out the data of the first resynch block stored in the memory 23, since the two head symbols of the first hutch represent the resynch number, the data in the third and subsequent symbols of the first hutch are supplied to the highly efficient decoding circuit 31. When the final hutch in the first resynch block is confirmed based on the boundary information detected by the aforesaid boundary information detecting circuit 25, the data in the third and subsequent symbols of the next hutch, i.e., the first hutch in the second resynch block, are now supplied to the highly efficient decoding circuit 31.

After that, by repeating the above operation for the third and subsequent resynch blocks, the highly efficient decoding circuit 31 produces digital image information restored to the original amount of information.

Let it now to be assumed that the incidence of error on the transmission line is so temporarily increased that the occurrence frequency of code errors exceeds the capability of the error correcting unit 27 and the error correction is continuously disabled to cause false correction or the like, thereby making the boundary information go to bankrupt.

Even in such an event, at the time when quality of the transmission line is restored to a normal level and the incidence of error comes into a coverage of the error correction capability, the above-mentioned embodiment permits detecting the new boundary information and also detect the resynch number present in the first two symbols of the hutch next to one corresponding to the bit at which the boundary flag is set. Thus, the image information can be restored to a normal state from the resynch block on which the resynch number has been detected.

In other words, even if the transmission line is temporarily damaged, the image reproduction can be quickly resumed in a perfect manner.

While, in the illustrated embodiment, the check bit for the error detection code is added to the boundary information (added information, first information) to form the code word and the check bit for the error correction code is added to both the boundary information and the compressed image information (main information, second information) to form the code word, the similar operating effect can be obtained in either case that the code word covered by the error correction code is formed for the added information or the main information along with the former.

As fully explained above, according to the system of the above embodiment, since the first error detection or correction code (error detection code) is made up for the first information (added information, boundary information) and the second error detection or correction code (error correction code) is made up for the second information (main information, compressed image information) along with the first information, it is possible to protect the first information with extremely high probability.

Furthermore, since the second error detection or correction code is arranged not including the check bit for the first error detection or correction code in the code word, it is possible to make short the code length, suppress an increase in the structural size of hardware, and achieve the processing at a relatively high speed.

Figure 9:
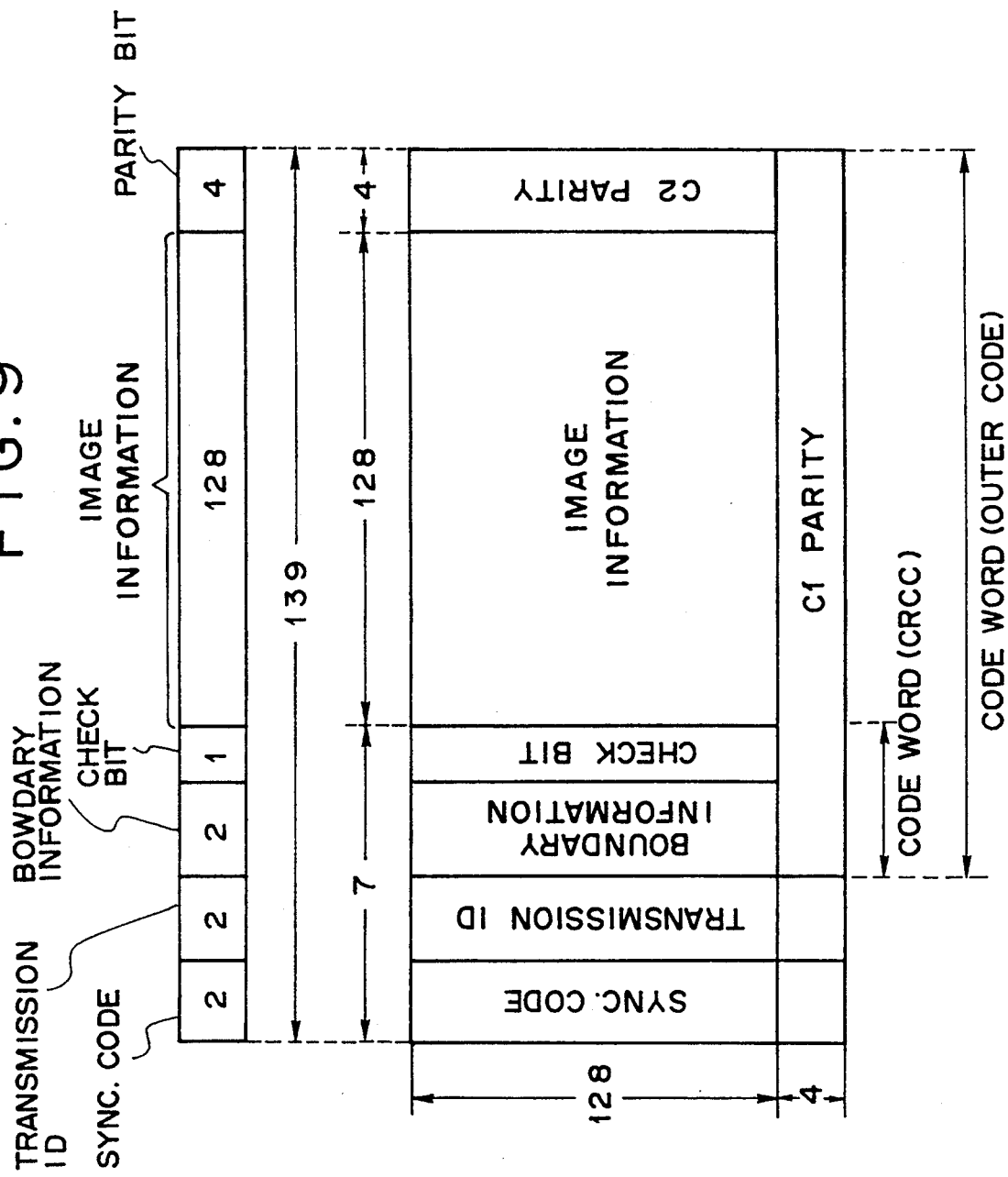
FIG. 9 is a diagram showing a data transmission format, particularly a format for an error correcting block, used in an image transmitting and receiving system according to another embodiment of the present invention.

Another embodiment of the present invention will be next described by referring to FIG. 9.

This embodiment is identical to the foregoing embodiment in the general entire construction, but different therefrom in the arrangement of an error correcting block.

FIG. 9 indicates a range of code word covered by the error detection code using a CRCC and a range of code word covered by the error correction code using an outer code of the double Reed.Solomon code. As will be seen from FIG. 9, the CRCC check bit of 1 symbol is added to the boundary information of 2 symbols.

Also, the outer code check bit (C2 parity) of 4 symbols for the error correction code are added to the boundary information of 2 symbols which has been subjected to the error detection coding, the CRCC check bit of 1 symbol and the image information of 128 symbols which has been subjected to the compression coding.

Since the C2 parity is coded including the CRCC in this way, this embodiment leads to an increase in the structural size of hardware, the computation time, etc. as compared with the foregoing embodiment. However, the protection of the CRCC provides an advantage of further improving correctness of the boundary information.

It should be understood that application of the present invention is not limited to the image signal coding device for use in the embodiments as stated above, and a remarkable advantage can also be obtained when the present invention is applied to those devices in which an image signal to be transmitted is subjected to variable length coding in units of certain region on a picture in general sense.

What is claimed is:

1. An image signal coding device, comprising:
   (a) coding means for carrying out variable length coding for each of plural regions resulting from dividing each picture provided by an image signal, and outputting image codes;
   (b) block forming means for forming a data block which includes the image codes;
   (c) boundary forming means for forming boundary information indicative of a position, in the data block, of the boundary between the image codes in each two adjacent regions of the divided regions, the boundary information being added to the data block; and
   (d) error detection or correction coding means for forming, in the data block, a first error detection or correction check code, with respect to the boundary information, which does not include the image codes, and a second error detection or correction check code with respect to the image codes and the boundary information.

2. A device according to claim 1, wherein the image code in each said data block comprises a plurality of hutches, and said boundary information indicates the position in said data block in units of hutch.

3. A device according to claim 2, wherein said block forming means adds indefinite bits to one of the hutches belonging to each region so that the image code in each region becomes an integer time a capacity of each hutch for containing the image code, and
   said boundary information indicates the position of said hutch, including said indefinite bits, in said data block.

4. A device according to claim 1, wherein said first error detection or correction check code is an error detection check code and said second error detection or correction check code is an error correction check code.

5. A device according to claim 4, wherein said first error detection or correction check code is a cyclic redundancy check code.

6. A device according to claim 1, wherein said second error detection or correction check code is arranged not including a check bit for said first error detection or correction check code.

7. A device according to claim 1, wherein said second error detection or correction check code is arranged including a check bit for said first error detection or correction check code.

8. An error detection or correction code coding device, comprising:
   (a) block forming means for forming a data block which includes main information and added information associated with the main information in time series;
   (b) first means for forming, in the data block, a first error detection or correction check code, with respect to the added information, which does not include main information; and
   (c) second means for forming a second error detection or correction check code, with respect to the main information and the added information, which does not include the first error detection or correction check code.

9. A device according to claim 8, wherein said first error detection or correction check code is an error detection check code and said second error detection or correction check code is an error correction check code.

10. A device according to claim 9, wherein said first error detection or correction check code is a cyclic redundancy check code.

11. An error detection or correction code coding device, comprising:

(a) first error detection or correction coding means for forming a first error detection or correction check code with respect to first information included in a data group which time serially includes the first information and a second information; and (b) second error detection or correction coding means for forming a second error detection or correction check code, with respect to the first and second information included in the data group, which does not include the first error detection or correction check code.

* * * * *

UNITED STATES PATENT AND TRADEMARK OFFICE
CERTIFICATE OF CORRECTION

PATENT NO. : 5,446,744

DATED : August 29, 1995

INVENTOR(S) : KENICHI NAGASAWA, ET AL.

Page 1 of 2

It is certified that error appears in the above-indentified patent and that said Letters Patent is hereby corrected as shown below:

TITLE PAGE, ITEM

[56] References Cited

Other Publications, "C. Yamamitsu A. Idle et al. 'An experimentay study for a home-use digital VRT' Jun. 9, 1989 pp. 450 to 456" should be deleted.

DRAWING

Sheet 9, Fig. 9, "BOWDARY" should read --BOUNDARY--.

COLUMN 1

Line 36, "inputted" should read --input--.

COLUMN 2

Line 54, ".difference" should read --difference--.

COLUMN 3

Line 38, "correction impossi-" should read --correction-impossi- --; and

Line 41, "type" should read --type of--.

COLUMN 6

Line 13, "performs" should read --perform--.

COLUMN 7

Line 15, "subblock" should read --sub-block--;

UNITED STATES PATENT AND TRADEMARK OFFICE
CERTIFICATE OF CORRECTION

PATENT NO. : 5,446,744
DATED : August 29, 1995
INVENTOR(S) : KENICHI NAGASAWA, ET AL.

It is certified that error appears in the above-indentified patent and that said Letters Patent is hereby corrected as shown below:

COLUMN 7

Line 17, "subblocks," should read --sub-blocks,--; and

Line 62, "error-can" should read --error can--.

COLUMN 9

Line 21, "subblocks" should read --sub-blocks--;

Line 22, "subblock," should read --sub-block,--;

Line 42, ".similar" should read --similar--;

Line 44, "subblocks" should read --sub-blocks--;

Line 49, "subblocks," should read --sub-blocks,--;

Line 61, "subblocks" should read --sub-blocks--; and

Line 63, "subblock," should read --sub-block,--.

COLUMN 10

Line 11, "subblocks," should read --sub-blocks,--.

Signed and Sealed this

Second Day of January, 1996

Attest:

BRUCE LEHMAN

*Attesting Officer*       *Commissioner of Patents and Trademarks*